United States Patent
Khvalkovskiy et al.

(10) Patent No.: US 10,573,363 B2
(45) Date of Patent: Feb. 25, 2020

(54) METHOD AND APPARATUS FOR PERFORMING SELF-REFERENCED READ IN A MAGNETORESISTIVE RANDOM ACCESS MEMORY

(71) Applicant: SAMSUNG ELECTRONICS CO., LTD., Suwon-si, Gyeonggi-do (KR)

(72) Inventors: Alexey Vasilyevich Khvalkovskiy, Moscow (RU); Vladimir Nikitin, Campbell, CA (US); Dmytro Apalkov, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/087,939

(22) Filed: Mar. 31, 2016

(65) Prior Publication Data
US 2017/0162246 A1 Jun. 8, 2017

Related U.S. Application Data

(60) Provisional application No. 62/262,172, filed on Dec. 2, 2015.

(51) Int. Cl.
G11C 11/16 (2006.01)

(52) U.S. Cl.
CPC ........ *G11C 11/1673* (2013.01); *G11C 11/161* (2013.01)

(58) Field of Classification Search
CPC ... G11C 11/1673; G11C 11/161; G11C 11/14; G11C 11/16; G11C 11/22; G11C 11/2273
USPC ...... 365/158, 97, 157, 173, 209, 213, 225.5, 365/225.6
See application file for complete search history.

(56) References Cited

U.S. PATENT DOCUMENTS

| | | |
|---|---|---|
| 5,748,519 A | 5/1998 | Tehrani et al. |
| 6,603,677 B2 | 8/2003 | Redon et al. |
| 6,950,335 B2 | 9/2005 | Dieny et al. |

(Continued)

FOREIGN PATENT DOCUMENTS

| | | |
|---|---|---|
| CN | 104051611 A | 9/2014 |
| KR | 10-2013-0137531 A | 12/2013 |

OTHER PUBLICATIONS

Kang et al., "An Overview of Spin-based Integrated Circuits," Design Automation Conference (ASP-DAC), 2014 19th Asia and South Pacific, Dec. 17, 2014, pp. 676-683, IEEE, DOI: 10.1109/ASPDAC.2014.6742969.

(Continued)

*Primary Examiner* — Alfredo Bermudez Lozada
(74) *Attorney, Agent, or Firm* — Innovation Counsel LLP

(57) ABSTRACT

A method of reading information stored in a magnetic memory. In a magnetic memory comprising a magnetic tunnel junction including a first reference layer and a free layer, and a spin orbit active (SO) line adjacent to the first reference layer of the magnetic tunnel junction, first and second currents are passed through the SO line so as to achieve two different directions of a magnetic moment of the first reference layer. Two electrical characteristics of the magnetic tunnel junction are determined, the two electrical characteristics corresponding to the two different directions of the magnetic moment of the first reference layer. These two electrical characteristics are then compared to determine the value of the stored information.

23 Claims, 9 Drawing Sheets

(56) References Cited

U.S. PATENT DOCUMENTS

| | | |
|---|---|---|
| 7,839,675 B2 | 11/2010 | Koo et al. |
| 7,960,757 B2 | 6/2011 | Ba Jalil et al. |
| 8,208,295 B2 | 6/2012 | Dieny |
| 8,238,064 B2 | 8/2012 | Yamada et al. |
| 8,238,145 B2 | 8/2012 | Abedifard |
| 8,350,347 B2 | 1/2013 | Gaudin et al. |
| 8,363,457 B2 | 1/2013 | Keshtbod |
| 8,384,171 B2 | 2/2013 | Gaudin et al. |
| 8,416,618 B2 | 4/2013 | Gaudin et al. |
| 8,611,145 B2 | 12/2013 | Zhou et al. |
| 8,792,269 B1 | 7/2014 | Abedifard et al. |
| 8,837,209 B2 | 9/2014 | Ohno et al. |
| 8,879,309 B2 | 11/2014 | Zhou et al. |
| 2003/0103393 A1* | 6/2003 | Asao ............ B82Y 10/00 365/200 |
| 2004/0179395 A1* | 9/2004 | Tsang ............ G11C 11/15 365/171 |
| 2005/0243598 A1* | 11/2005 | Lin ............ G11C 11/1673 365/158 |
| 2010/0110785 A1* | 5/2010 | Chen ............ G11C 7/062 365/171 |
| 2014/0010004 A1 | 1/2014 | Suzuki |
| 2014/0056060 A1 | 2/2014 | Khvalkovskiy et al. |
| 2014/0056061 A1* | 2/2014 | Khvalkovskiy ......... H01L 43/02 365/158 |
| 2014/0169088 A1 | 6/2014 | Buhrman et al. |
| 2014/0252439 A1 | 9/2014 | Guo |
| 2014/0312441 A1 | 10/2014 | Guo |
| 2015/0041934 A1* | 2/2015 | Khvalkovskiy ......... H01L 43/02 257/421 |

OTHER PUBLICATIONS

Bishnoi et al., "Architectural Aspects in Design and Analysis of SOT-based Memories," Design Automaton Conference (ASP-DAC), 2014 19th Asia and South Pacific, Dec. 17, 2014, pp. 700-707, IEEE, DOI: 10.1109/ASPDAC.2014.6742972.

* cited by examiner

METHOD AND APPARATUS FOR PERFORMING SELF-REFERENCED READ IN A MAGNETORESISTIVE RANDOM ACCESS MEMORY

This application claims the benefit of U.S. Provisional Patent Application Ser. No. 62/262,172, filed on Dec. 2, 2015 and entitled SELF-REFERENCED READ, which is incorporated herein by reference in its entirety and for all purposes.

BRIEF DESCRIPTION

Embodiments of the present disclosure relate generally to magnetoresistive random access memory (MRAM). More specifically, embodiments of the present disclosure relate to the performance of self-referenced read operations in MRAM.

BACKGROUND

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. For example, FIG. 1 illustrates a conventional magnetic tunneling junction (MTJ) 10 and its use in a conventional STT-RAM. The conventional MTJ 10 includes a top electrode contact (TEC) 12 which can be part of or in electrical contact with a bit line, an optional top reference layer 14, a free layer 16, and a bottom reference layer 18, as well as a spin orbit active (SO) line 19.

The TEC 12 is a conventional conductive line or electrode. The top reference layer 14 and bottom reference layer 18 are conventional MTJ magnetic reference layers, where both the top reference layer 14 and the bottom reference layer 18 have a magnetization (magnetic moment) that is fixed, or pinned, in a particular direction, typically by an exchange-bias interaction with one or more conventional antiferromagnetic layers (not shown).

The free layer 16 is a conventional MTJ free layer whose magnetic moment can be changed. To switch the magnetization or magnetic moment of the conventional free layer 20, a current is driven through the stack of the MTJ 10. The current carriers are spin polarized and exert a torque on the magnetization of the conventional free layer 16 as the current carriers pass through the conventional free layer 16. When a sufficient current is driven through the MTJ 10, the resulting torque will switch the magnetization direction according to the direction of the current. The differences in magnetic configurations correspond to different magnetoresistances and thus different logical states (e.g. a logical "0" and a logical "1") of the conventional MTJ 10.

In applications such as STT-RAM, memory cells including conventional magnetic junctions 10 are selected. Typically, this is accomplished by configuring each memory cell to include both the conventional MTJ 10 and a selection transistor (not shown in FIG. 1). When the transistor is turned on, for example by a voltage applied to the transistor's gate, current can be driven through the conventional dual MTJ 10. This current can be a read current or a write current for STT writing. Data may thus be written to or read from the conventional MTJ 10.

In a conventional read operation, read current $I_{read}$ is passed through the MTJ 10 as shown, and a separate sense-amp compares this read current with the current $I_{ref}$ flowing through a reference cell. If $I_{read} < I_{ref}$ then the MTJ 10 is in a high-R state relative to the reference cell, corresponding to, for example, logical "0". Alternatively, when $I_{read} > I_{ref}$ the MTJ 10 is in a low-R state relative to the reference cell, corresponding to a logical "1".

However, this conventional read operation requires a tight distribution of the resistances in the high and low states. Variations in the fabrication process of the transistor and MTJ, as well as different lead resistances across the chip, can cause overlap of the high and low states for the MTJ array, leading to a read error. One solution to this problem is to add a separate reference cell near each memory MTJ, but this leads to additional memory complexity, and reduced memory chip density. Efforts thus exist to perform read operations in MRAM cells without need for a reference cell.

SUMMARY

The invention can be implemented in many different ways. In one exemplary embodiment, a magnetic memory comprises: a magnetic tunnel junction including a first reference layer and a free layer; a spin orbit active (SO) line adjacent to the first reference layer of the magnetic tunnel junction, the SO line arranged to pass a first SO current in a first direction therethrough and a second SO current in a second direction therethrough; and a controller in electrical communication with the magnetic tunnel junction. The controller is programmed to perform a read operation by passing the first and second SO currents through the SO line so as to generate two different directions of a magnetic moment in the first reference layer, by determining two corresponding electrical characteristics of the magnetic tunnel junction, and by comparing the two corresponding electrical characteristics.

The read operation may further comprise, in order: initiating transmission of the first SO current through the SO line so as to reverse a direction of a magnetic moment of the first reference layer; initiating transmission of a first read current through the magnetic tunnel junction; initiating transmission of the second SO current through the SO line so as to reverse the direction of the magnetic moment of the first reference layer; initiating transmission of a second read current through the magnetic tunnel junction; and comparing a magnitude of the first read current to the magnitude of the second read current so as to determine information stored in the memory.

The transmission of a first read current may occur during the transmission of the first SO current, and the transmission of a second read current may occur during the transmission of the second SO current.

The comparing a magnitude may further comprise: determining the information stored in the memory to be a first binary value if the magnitude of the first read current is greater than the magnitude of the second read current; and determining the information stored in the memory to be a second binary value if the magnitude of the first read current is not greater than the magnitude of the second read current.

The magnetic memory may further comprise a comparator circuit in electrical communication with the SO line or bit line, the comparator circuit having a first capacitor and a second capacitor. The read operation may further comprise, in order: initiating transmission of the first SO current through the SO line so as to reverse a direction of a magnetic moment of the first reference layer; initiating transmission of a first read current through the magnetic tunnel junction, the first read current generating a first voltage at the SO line; storing the first voltage in the first capacitor; initiating transmission of the second SO current through the SO line so as to reverse the direction of the magnetic moment of the first reference layer; initiating transmission of a second read current through the magnetic tunnel junction, the second read current generating a second voltage at the SO line; storing the second voltage in the second capacitor; and comparing a magnitude of the stored first voltage to the magnitude of the stored second voltage so as to determine information stored in the memory.

The comparing a magnitude may further comprise: determining the information stored in the memory to be a first binary value if the magnitude of the stored first voltage is greater than the magnitude of the stored second voltage; and determining the information stored in the memory to be a second binary value if the magnitude of the stored first voltage is not greater than the magnitude of the stored second voltage.

The magnetic memory may further comprise a plurality of the magnetic tunnel junctions, the SO line adjacent to and in electrical communication with each magnetic tunnel junction of the plurality of magnetic tunnel junctions.

The magnetic memory may further comprise a comparator circuit in electrical communication with the SO line, the comparator circuit having a first capacitor and a second capacitor.

The magnetic tunnel junctions of the plurality of magnetic tunnel junctions may share a common first reference layer.

A conductivity of the SO line may be greater than the conductivity of the first reference layer.

The magnetic memory may further comprise a plurality of switching elements each in electrical communication with the SO line and each positioned to correspond to one of the magnetic tunnel junctions.

Each switching element may be aligned with a geometric center of one of the magnetic tunnel junctions. For each magnetic tunnel junction, the first and second SO currents may be passed through the switching elements corresponding to magnetic tunnel junctions adjacent to the each magnetic tunnel junction.

Each switching element may be positioned between adjacent magnetic tunnel junctions. For each magnetic tunnel junction, the first and second SO currents may be passed through the switching elements positioned between the each magnetic tunnel junction and adjacent magnetic tunnel junctions.

The magnetic tunnel junction may further comprise a second reference layer, the magnetic tunnel junction having, in order, the first reference layer, the free layer, and the second reference layer.

The magnetic memory may further comprise a bit line in electrical communication with the magnetic tunnel junction, and the magnetic memory may further comprise a comparator circuit in electrical communication with the bit line, the comparator circuit having a first capacitor and a second capacitor. The read operation may further comprise, in order: initiating transmission of the first SO current through the SO line so as to reverse a direction of a magnetic moment of the first reference layer; initiating transmission of a first read current through the magnetic tunnel junction, the first read current generating a first voltage at the bit line; storing the first voltage in the first capacitor; initiating transmission of the second SO current through the SO line so as to reverse the direction of the magnetic moment of the first reference layer; initiating transmission of a second read current through the magnetic tunnel junction, the second read current generating a second voltage at the bit line; storing the second voltage in the second capacitor; and comparing a magnitude of the stored first voltage to the magnitude of the stored second voltage so as to determine information stored in the memory.

In another embodiment, a method of reading information stored in a magnetic memory may comprise: in a magnetic memory comprising a magnetic tunnel junction including a first reference layer and a free layer, and a spin orbit active (SO) line adjacent to the first reference layer of the magnetic tunnel junction, passing first and second currents through the SO line so as to achieve two different directions of a magnetic moment of the first reference layer; determining two electrical characteristics of the magnetic tunnel junction, the two electrical characteristics corresponding to the two different directions of the magnetic moment of the first reference layer; and comparing the two electrical characteristics.

The two electrical characteristics may be voltages. The two electrical characteristics may be electrical currents.

The first and second currents may be first and second SO currents. The passing, the determining, and the comparing may collectively further comprise: transmitting the first SO current through the SO line so as to reverse a direction of a magnetic moment of the first reference layer; transmitting a first read current through the magnetic tunnel junction; transmitting the second SO current through the SO line so as to reverse the direction of the magnetic moment of the first reference layer; transmitting a second read current through the magnetic tunnel junction; and comparing a magnitude of the first read current to the magnitude of the second read current so as to determine the information stored in the memory.

The magnetic memory may further comprise a comparator circuit in electrical communication with the SO line, the comparator circuit having a first capacitor and a second capacitor. The first and second currents may be first and second SO currents. The passing, the determining, and the comparing may collectively further comprise, in order: transmitting the first SO current through the SO line so as to reverse a direction of a magnetic moment of the first reference layer; transmitting a first read current through the magnetic tunnel junction, the first read current generating a first voltage at the SO line; storing the first voltage in the first capacitor; transmitting the second SO current through the SO line so as to reverse the direction of the magnetic moment of the first reference layer; transmitting a second read current through the magnetic tunnel junction, the second read current generating a second voltage at the SO line; storing the second voltage in the second capacitor; and comparing a magnitude of the stored first voltage to the magnitude of the stored second voltage so as to determine the information stored in the memory.

The passing may further comprise passing the first and second currents through only a portion of the SO line proximate to the magnetic tunnel junction.

In a further embodiment, a magnetic memory comprises: a magnetic tunnel junction including a reference layer and a free layer; a spin orbit active (SO) line adjacent to the reference layer of the magnetic tunnel junction, the SO line arranged to pass a current therethrough; and a controller in electrical communication with the magnetic tunnel junction. The controller is programmed to perform a read operation, the read operation comprising: determining a first electrical characteristic of the magnetic tunnel junction; passing the current through the SO line so as to change a direction of a magnetic moment of the first reference layer by less than 90°; after the passing, determining a second electrical characteristic of the magnetic tunnel junction; and comparing the first and second electrical characteristics.

The first and second electrical characteristics may both be electrical currents or both be voltages.

BRIEF DESCRIPTION OF THE FIGURES

For a better understanding of the invention, reference should be made to the following detailed description taken in conjunction with the accompanying drawings, in which.

Like reference numerals refer to corresponding parts throughout the drawings. The various Figures are not necessarily to scale.

DETAILED DESCRIPTION

As used herein, the term magnetic could include ferromagnetic, ferrimagnetic or like structures. Thus, as used herein, the term "magnetic" or "ferromagnetic" includes, but is not limited to ferromagnets and ferrimagnets. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

One embodiment of the invention provides an MRAM read operation. Current in the SO line acts to reverse the magnetization direction of the adjacent reference layer. Accordingly, a first current is passed through the SO line to switch the magnetization direction of the bottom reference layer. A read current is then passed through the MTJ, and this current value is recorded. A second current is next passed through the SO line in the opposite direction as the first current, reversing the magnetization direction of the bottom reference layer once again. Another read current is then passed through the MTJ, and the two read currents are compared. The difference between the two read currents indicates the logic state of the MTJ. Embodiments of the invention thus allow for a self-referenced read operation employing an SO line to alter the magnetization direction of a reference layer, rather than the free layer.

Figure 1:
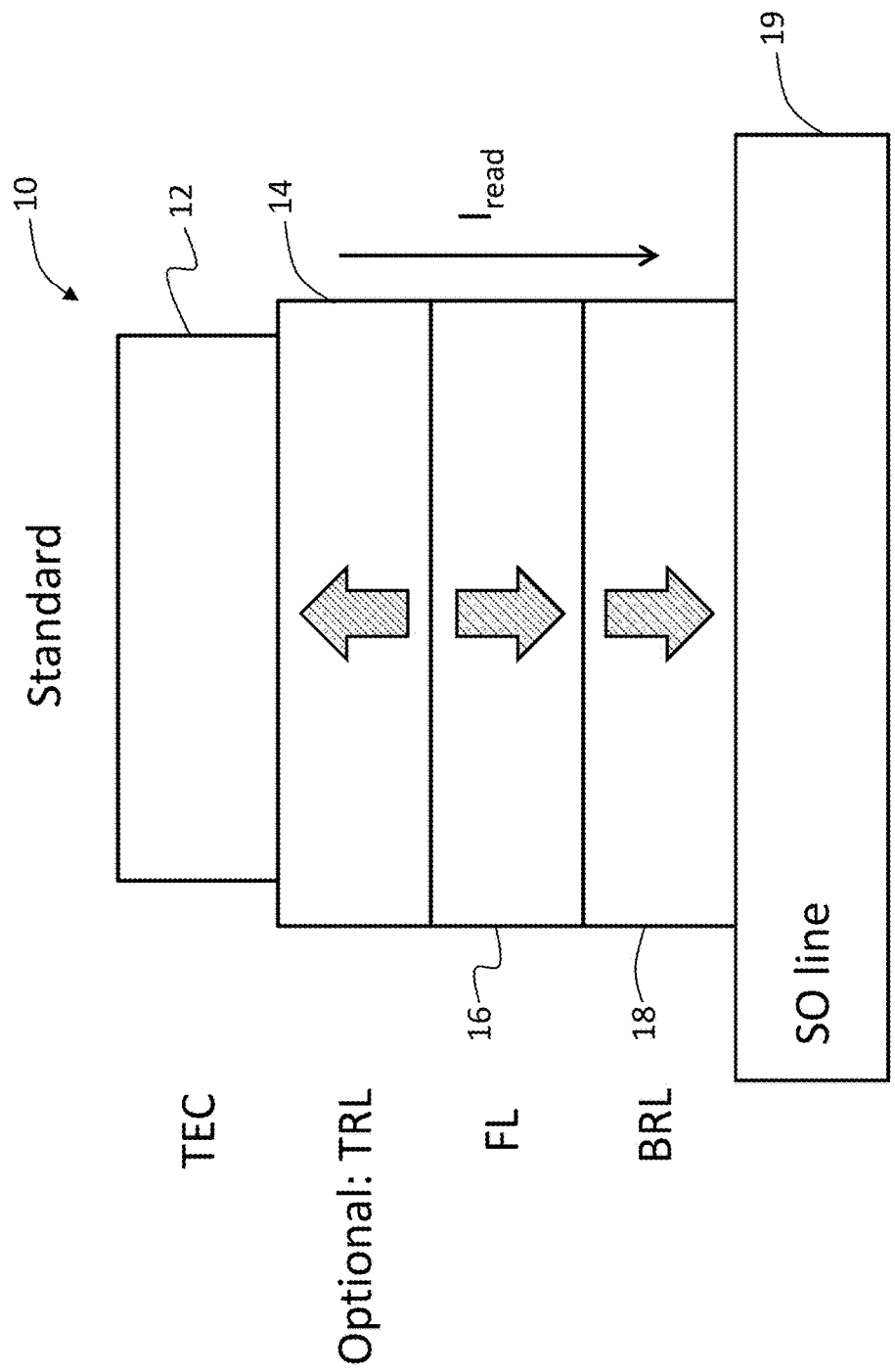
FIG. 1 illustrates a conventional MRAM read operation.
Figure 2:
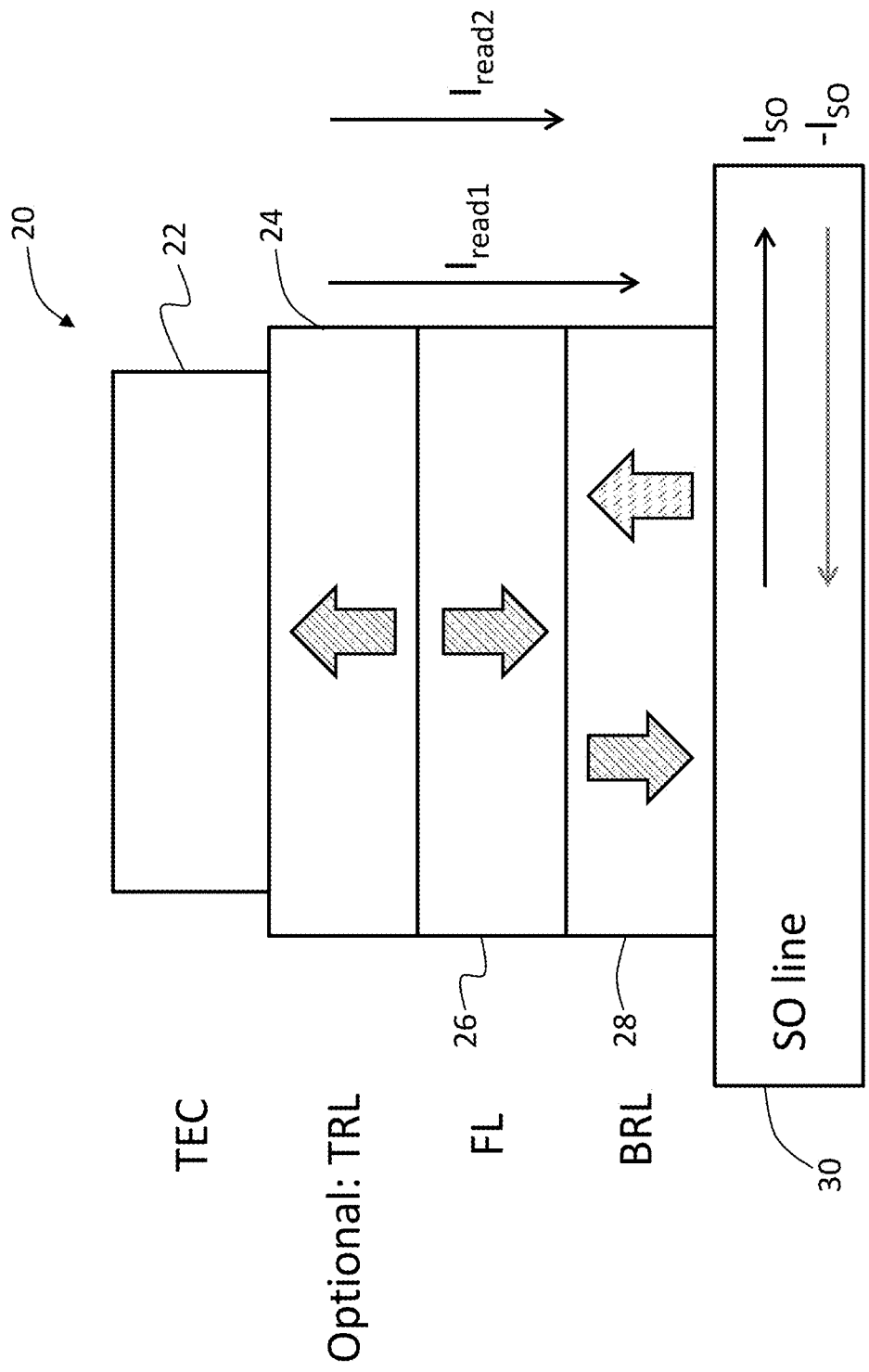
FIG. 2 illustrates an MRAM read operation performed according to an embodiment of the present invention.

FIG. 2 illustrates an MRAM read operation performed according to an embodiment of the present invention. In such a read operation, an MTJ 20, which can be an MTJ of an STT-RAM, is employed, having a TEC layer 22, optional top reference layer 24, free layer 26, bottom reference layer 28, and SO line 30. The TEC layer 22, optional top reference layer 24, free layer 26, bottom reference layer 28, and SO line 30 may each be constructed similar to corresponding elements of MTJ 10 above.

The free and reference layers 24, 26, and 28 are ferromagnetic and thus may include one or more of Fe, Ni, and Co. The magnetic moments of the layers 24, 26, and 28 may be perpendicular to plane as shown. Thus, each of the layers 24, 26, and 28 may have a perpendicular anisotropy field that exceeds its out-of-plane demagnetization field (typically a significant fraction of $4\pi M_s$). In other embodiments, the magnetic moments are in-plane.

The SO line 30 may be made of any suitable material exhibiting a sufficiently large spin Hall effect. Materials that exhibit the spin Hall effect often include heavy metals or materials doped by heavy metals. For example, such materials can be selected from at least one of A and M doped by B. A includes Y, Zr, Nb, Mo, Tc, Ru, Rh, Pd, Cd, In, Sb, Te, Hf, Ta (including high-resistive amorphous β-Ta), W, Re, Os, Ir, Pt, Au, Hg, Tl, Pb, Bi, Po, At, and/or their combinations; M includes at least one of Al, Ti, V, Cr, Mn, Cu, Zn, Ag, Hf, Ta, W, Re, Pt, Au, Hg, Pb, Si, Ga, GaMn or GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb. In some embodiments, the SO line 30 may include or consist of Ir doped Cu and/or Bi doped Cu. The doping is generally in the range of 0.1 through 10 atomic percent. In other embodiments, other materials may be used.

In operation, and as shown in FIG. 2, the MTJ 20 may be a perpendicular MTJ whose magnetic moments are generated perpendicular to their substrate surface (in this case, perpendicular to the upper surface of the SO line 30). Current generated in the SO line 30 can reverse the direction of the magnetic moment of an adjacent reference layer 28 according to phenomena that can be referred to as the spin Hall effect, Rashba effect, or spin-orbit torque. Accordingly, a first current $I_{SO}$ is passed through the SO line 30 in a particular direction (in this example, rightward). A current passed in this direction can thus generate, for example, a downward magnetic moment in bottom reference layer 28, as shown by the leftmost arrow in layer 28 of FIG. 2. When the magnetic moments of optional top reference layer 24 and free layer 26 are as shown in FIG. 2, the magnetic moments of the bottom reference layer 28 and free layer 26 are aligned (parallel), resulting in low overall MTJ resistance. A voltage is then applied across the MTJ 20, generating a read current $I_{read1}$ through the MTJ 20. As the overall MTJ resistance is low due to the aligned magnetic moments of the free layer 26 and bottom reference layer 28, this read current $I_{read1}$ is relatively high. The value of the read current $I_{read1}$ is recorded or stored via known current sensing circuitry.

A second current $-I_{SO}$ is then passed through the SO line 30 in a direction opposite to that of the first current $I_{SO}$. This reverses the magnetic moment in bottom reference layer 28, orienting it upward as shown by the rightmost arrow in layer 28 of FIG. 2. The magnetic moments of the bottom reference layer 28 and free layer 26 are thus opposite to each other (antiparallel), resulting in higher overall MTJ resistance. The same voltage as that which generated read current $I_{read1}$ is then applied again to the MTJ 20, generating another read current $I_{read2}$. The value of the read current $I_{read2}$ may then be recorded or stored via the same current sensing circuitry as above.

As the overall MTJ resistance is now higher due to the antiparallel magnetic moments of the free layer 26 and bottom reference layer 28, read current $I_{read2}$ is lower than read current $I_{read1}$. Thus, the two stored/recorded read currents $I_{read1}$ and $I_{read2}$ may be compared, such as by known current comparison circuits, to determine which is greater. In the example shown, $I_{read1} > I_{read2}$, which may correspond to logical "0". As one or ordinary skill in the art will observe, if the magnetic moment of the free layer 16 is reversed, i.e. a different logical state is written to the MTJ 20, and $I_{read2} > I_{read1}$, this would correspond in such a case to a logical "1".

One of ordinary skill in the art will also observe that these state representations may be reversed if desired, so that $I_{read1} > I_{read2}$ may correspond to logical "1" and $I_{read2} > I_{read1}$ may correspond to a logical "0".

In time domain, the current through the SO line ($+I_{SO}$ or $-I_{SO}$) and the read current ($I_{read1,2}$) may be separated in time. However in some embodiments it is desired that the read current Iread1,2 flows essentially at the same time as the current through the SO line ($+I_{SO}$ or $-I_{SO}$).

Figure 3:
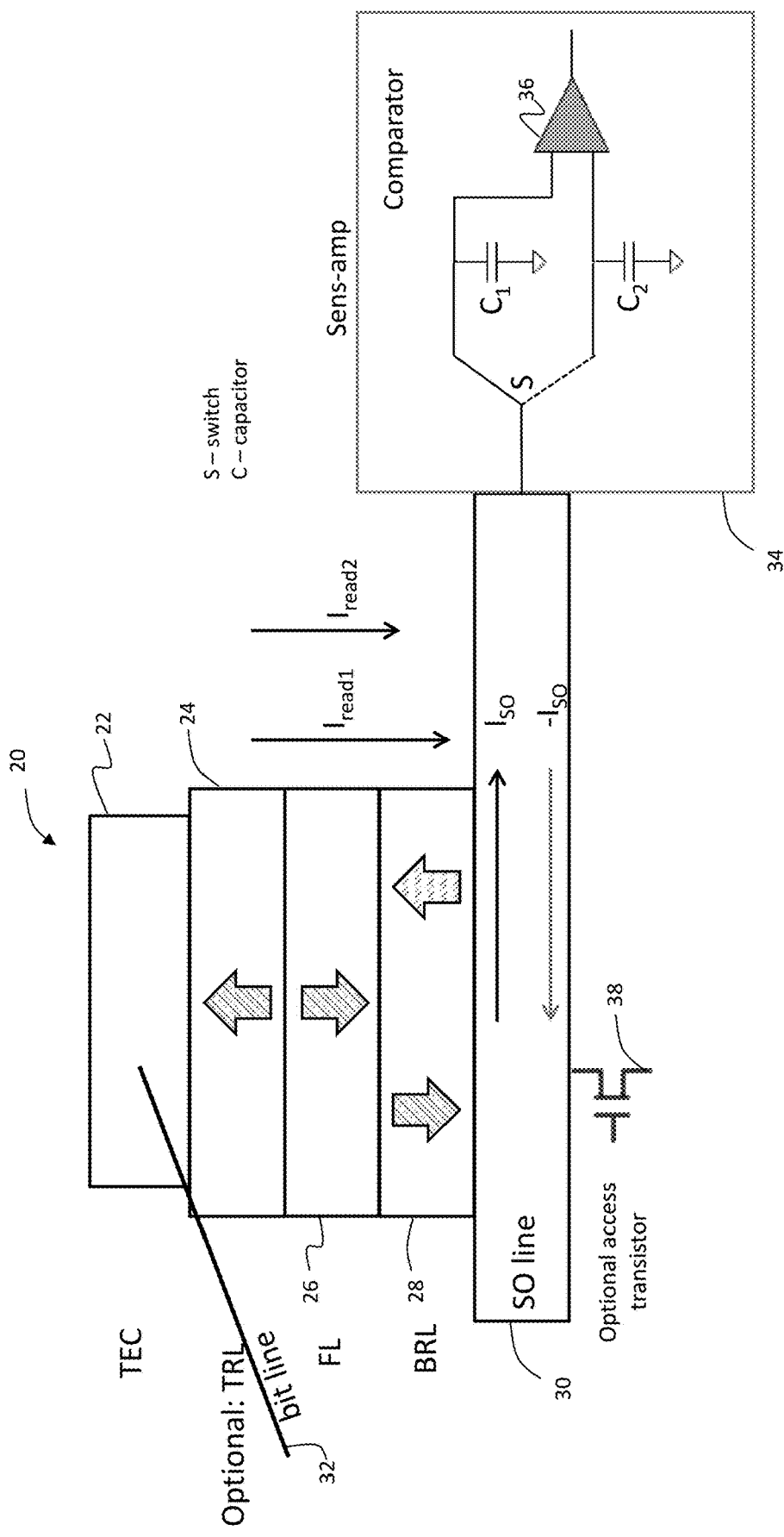
FIG. 3, FIG. 4, FIG. 5, FIG. 6, FIG. 7, and FIG. 8 illustrate MRAM read operations performed according to further embodiments of the present invention.

FIG. 3 illustrates an MRAM system and read operation of a further embodiment of the present invention. Here, the SO line 30 of MTJ 20 is connected to a known access transistor 38 for performing read/write operations, and to an additional comparator circuit 34 which has a switch S connected between two capacitors $C_1$ and $C_2$, as well as a comparator 36. The comparator circuit 34 may be connected to the SO line 30 as shown, or to the TEC layer 22 or bit line 32.

In the previous embodiment of FIG. 2, read operations were conducted by applying a constant voltage across the MTJ 20 and comparing the resulting read currents. In contrast, the embodiment of FIG. 3 applies a constant current through the MTJ 20 and compares the resulting voltages. More specifically, in operation, a first current $I_{SO}$ is passed through the SO line 30 in the direction shown (rightward), which switches the magnetic moment of bottom reference line 28, for example, upward. Switch S may then be toggled to connect capacitor $C_1$ to SO line 30, and bit line 32 may be activated to transmit a constant read current $I_{read1}$ through the layers of MTJ 20. The resulting voltage $V_{read1}$ on SO line 30 is stored in capacitor $C_1$. That is, a voltage proportional to the MTJ 20 resistance with the bottom reference layer 28 in its up state is stored in capacitor $C_1$.

A second current $-I_{SO}$ opposite to first current $I_{SO}$ is then passed through SO line 30 as shown, which again switches the direction of the magnetic moment of reference line 28. The switch S is then toggled to connect capacitor $C_2$ to SO line 30, and bit line 32 is activated to transmit read current $I_{read2}$ through the layers of MTJ 20, where $I_{read2}$. The resulting voltage $V_{read2}$ on SO line 30 is stored in capacitor $C_2$. That is, a voltage proportional to the MTJ 20 resistance with the bottom reference layer 28 in its down state is stored in capacitor $C_2$.

The comparator 36 then compares the two stored voltages of capacitors $C_1$ and $C_2$. If $V_{read1} > V_{read2}$, then it is determined that a logical "0" is stored in the MTJ 20, otherwise a logical "1" is stored therein (or vice versa).

Figure 4:
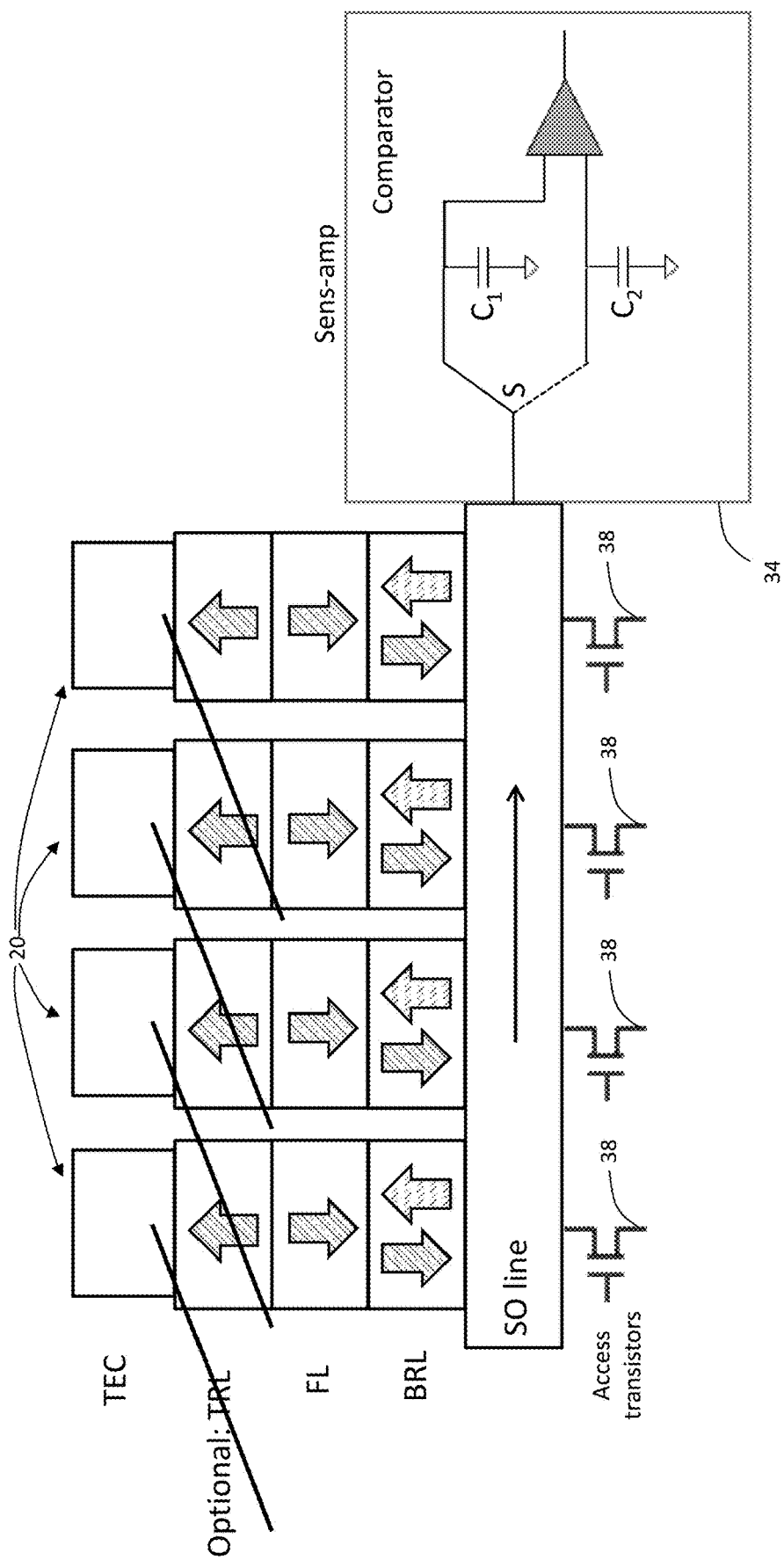

FIG. 4 illustrates an embodiment similar to that of FIG. 3, except that multiple cells 20 are located on the same SO line 30. Any number of cells 20 may be positioned along the SO line 30. Read operations for any of the cells 20 of FIG. 4 may be conducted according to any of the embodiments herein, with currents being passed through the SO line 30 to switch the magnetic moment polarity of all bottom reference layers 28 simultaneously. The cells 20 may be read using a constant-voltage scheme as illustrated in FIG. 2, or may employ a comparator circuit 34 so as to be read using a constant-current scheme as illustrated in FIG. 3.

Figure 5:
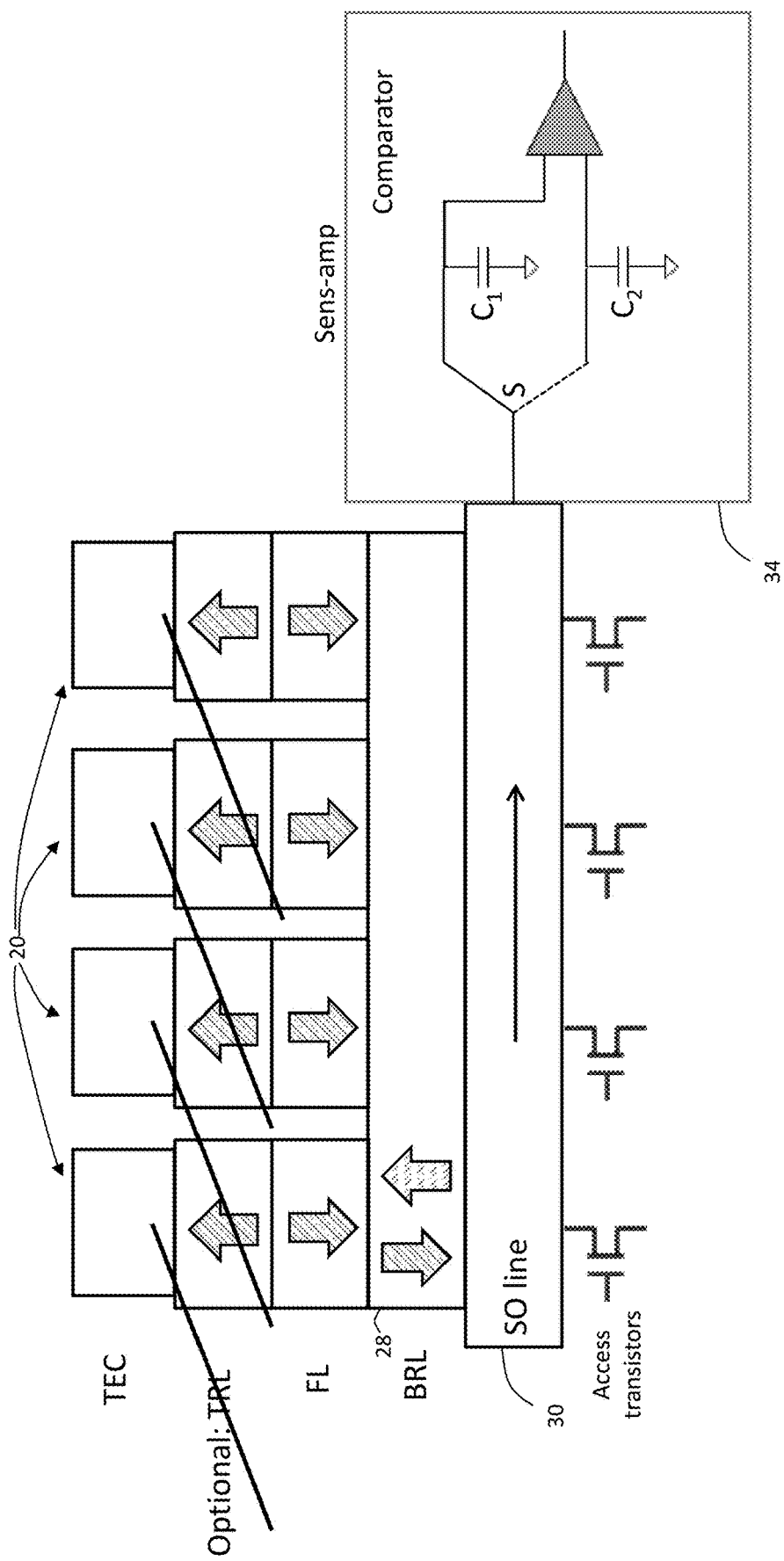

FIG. 5 illustrates a further embodiment of the present invention. This embodiment is similar to that of FIG. 4, with multiple cells 20 located on the same SO line 30, except that a single bottom reference line 28 is common to all cells 20, rather than separate bottom reference lines 28 existing for each separate cell 20. This avoids the need to pattern the bottom reference layer 28, thus saving process time and cost.

Read operations are performed on the cells 20 according to any of the embodiments herein. The cells 20 may be read using a constant-voltage scheme as illustrated in FIG. 2, or may employ a comparator circuit 34 so as to be read using a constant-current scheme as illustrated in FIG. 3. However, in this embodiment, it may be desirable for the SO line 30 to have a high conductivity relative to the extended bottom reference layer 28, to prevent SO line 30 currents from passing through the bottom reference layer 28 instead.

Figure 6:
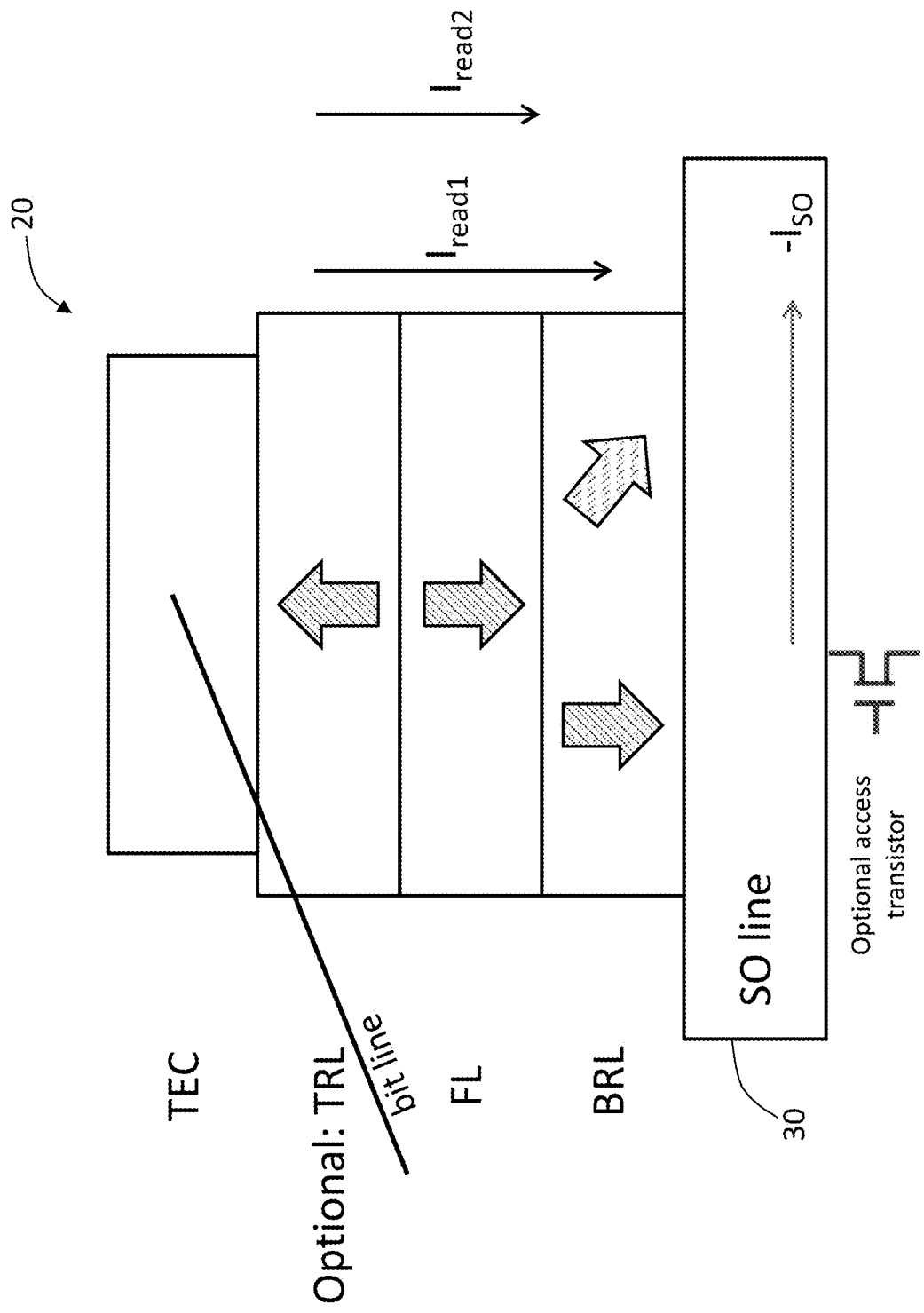

FIG. 6 illustrates a still further embodiment of the present invention. In this embodiment, read operations are conducted by rotating the magnetic moment vector by an angle less than 90°, i.e. from upward or downward to some non-perpendicular angle (relative to the SO line 30, or relative to the silicon substrate upon which the MTJ 20 is fabricated), so that the resistance of bottom reference layer 28 is increased/decreased by some smaller amount than that generated in previous embodiments, while still being detectable by the same methods.

In this embodiment, as the bottom reference layer is shown as being patterned, it may be desirable for the read currents $I_{read}$ to be transmitted during the corresponding $I_{SO}$ pulses, so that the torque from the $I_{SO}$ pulses dominates in determining the direction of the magnetic moment vector. In this case, it may also be desirable for any comparator circuit 34, if used, to be connected to the bit line rather than the SO line 30.

In operation then, without passing a first current $I_{SO}$ through the SO line 30, the magnetic moment of bottom reference layer 28 is initially in its pre-defined orientation perpendicular to the substrate or SO line 30, i.e. pointing upward or downward. A first read current $I_{read1}$ is then passed through the MTJ 20 and is detected/stored as in previous embodiments. Alternatively, a comparator circuit 34 may be employed and the corresponding read voltage $V_{read1}$ may be stored in capacitor $C_1$ as in FIG. 3. Once this electrical characteristic (current or voltage) value is stored or recorded, a current $I_{SO}$ is passed through the SO line 30, to tilt the direction of the magnetic moment away from the perpendicular. That is, the current $I_{SO}$ of this embodiment may be lower than in previous embodiments, and in particular may be only that magnitude necessary to tilt the magnetic moment of reference layer 28 by an amount resulting in a detectable difference in read current or voltage. Embodiments of the invention contemplate any magnitude of current $I_{SO}$, and any amount of change in the direction of the magnetic moment of bottom reference layer 28, that results in a detectable difference in read current/voltage.

Once the current $I_{SO}$ tilts the magnetic moment of bottom reference layer 28 by some amount, as shown by the rightmost arrow of layer 28 in FIG. 6, a second read current $I_{read2}$ is passed through the MTJ 20 and either it or the resulting read voltage is compared to that of $I_{read1}$. As in previous embodiments, the difference between these read currents or read voltages determines the information stored in MTJ 20. Here, however, as the magnetic moment vector is tilted by an amount less than that in previous embodiments, the required current $I_{SO}$ is lower, and the resulting difference in magnitude between the read currents/voltages is also lower.

As in previous embodiments, there may be multiple MTJs 20 with either a common bottom reference layer 28 or each having separate such layers 28. One of ordinary skill in the art will also realize that this embodiment utilizes only a single SO current, rather than two. That is, a current is passed through the SO line 30 only once per read operation, to tilt the magnetic moment of layer 28 a single time. This is in contrast to previous embodiments, which passed two opposing currents through SO line 30 and reversed the polarity of the magnetic moment of layer 28 twice per read operation. In this manner, the embodiment of FIG. 6 provides a simpler read operation that consumes less current and may take less time to execute.

Figure 7:
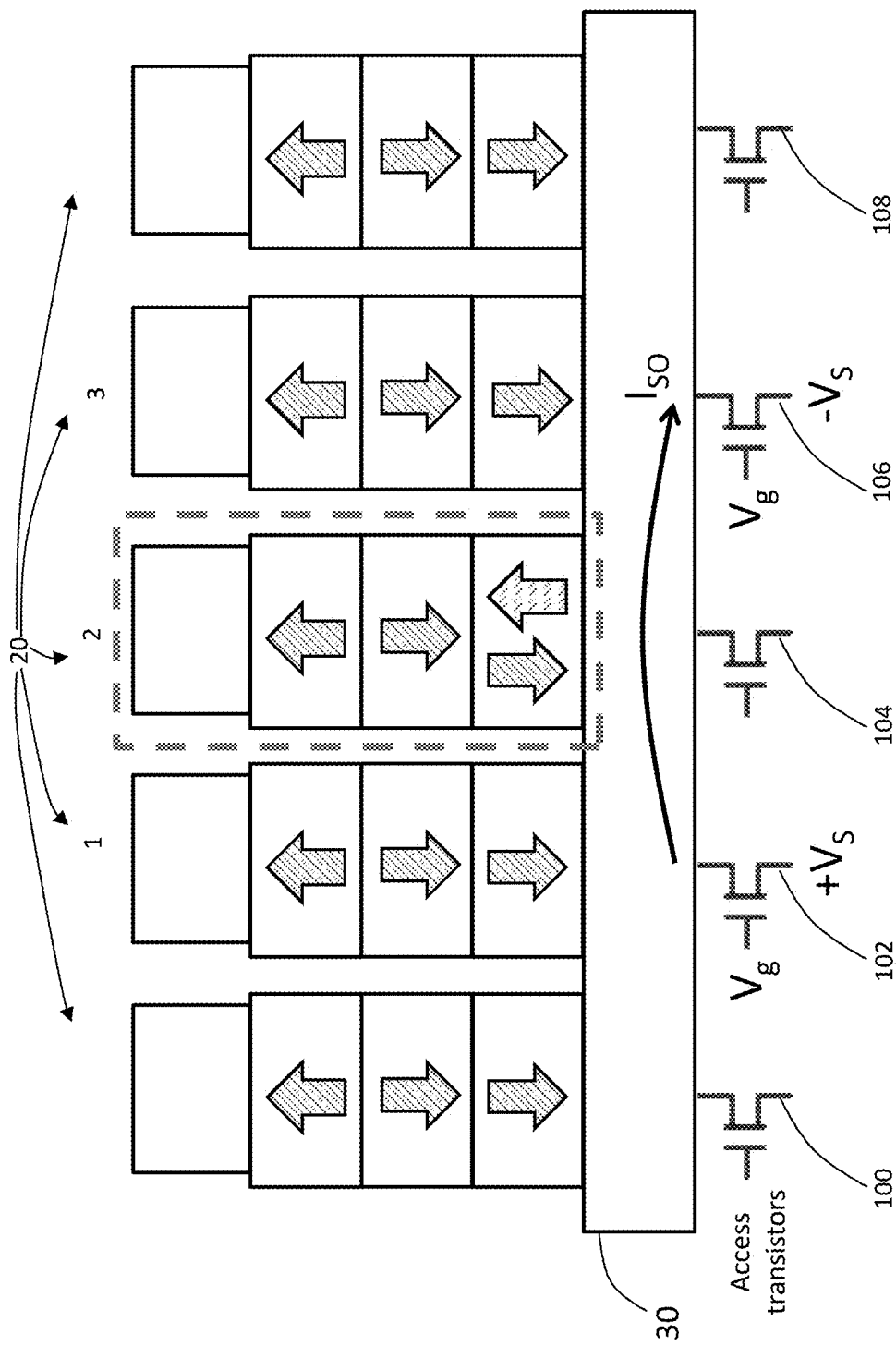

FIG. 7 illustrates another embodiment of the present invention. In previous embodiments, read operations involved passing currents $I_{SO}$ through the entire SO line. The resistance of the SO line may, however, result in undesired resistive losses and therefore require an undesirably high bias voltage to generate such currents. The embodiment of FIG. 7 thus passes currents $I_{SO}$ through only a localized portion of the SO line.

More specifically, each MTJ 20 has an associated access transistor 100, 102, 104, 106, 108 as shown, which is used as a switching element for passing read/write currents through the MTJs 20. That is, a voltage is applied to bit lines of the MTJs 20, and transistors 100, 102, 104, 106, 108 are switched on, allowing a current to flow from the bit lines through the selected MTJs 20 and transistors 100, 102, 104, 106, 108, thus allowing information to be written to or read from the selected MTJs 20. In addition to being used for passing current through MTJs 20, these access transistors 100, 102, 104, 106, 108 may also be used to pass currents $I_{SO}$ through localized portions of their SO line, for carrying out read operations of embodiments of the invention. In particular, during a read operation on a particular MTJ 20, the access transistors to each side of that MTJ 20 along the SO line 30 may be turned on and a voltage may be applied across them, thus passing a current only through the intervening portion of SO line 30.

For example, in FIG. 7, if a read operation is to be performed on the middle MTJ 20, the adjacent access transistors 102 and 106 are switched on (i.e. gate voltage $V_g$ is applied to each), source voltage $+V_s$ is applied to access transistor 102, and source voltage $-V_s$ is applied to access transistor 106. The resulting current $I_{SO}$ is passed from access transistor 102 through the SO line 30 and into access transistor 106. In this manner, current $I_{SO}$ is generated in only the localized portion of SO line 30 near the middle MTJ 20, reducing resistive losses and the bias voltage required to generate $I_{SO}$. One of ordinary skill in the art will observe that read operations can be carried out with this localized current $I_{SO}$ as in previous embodiments.

Figure 8:
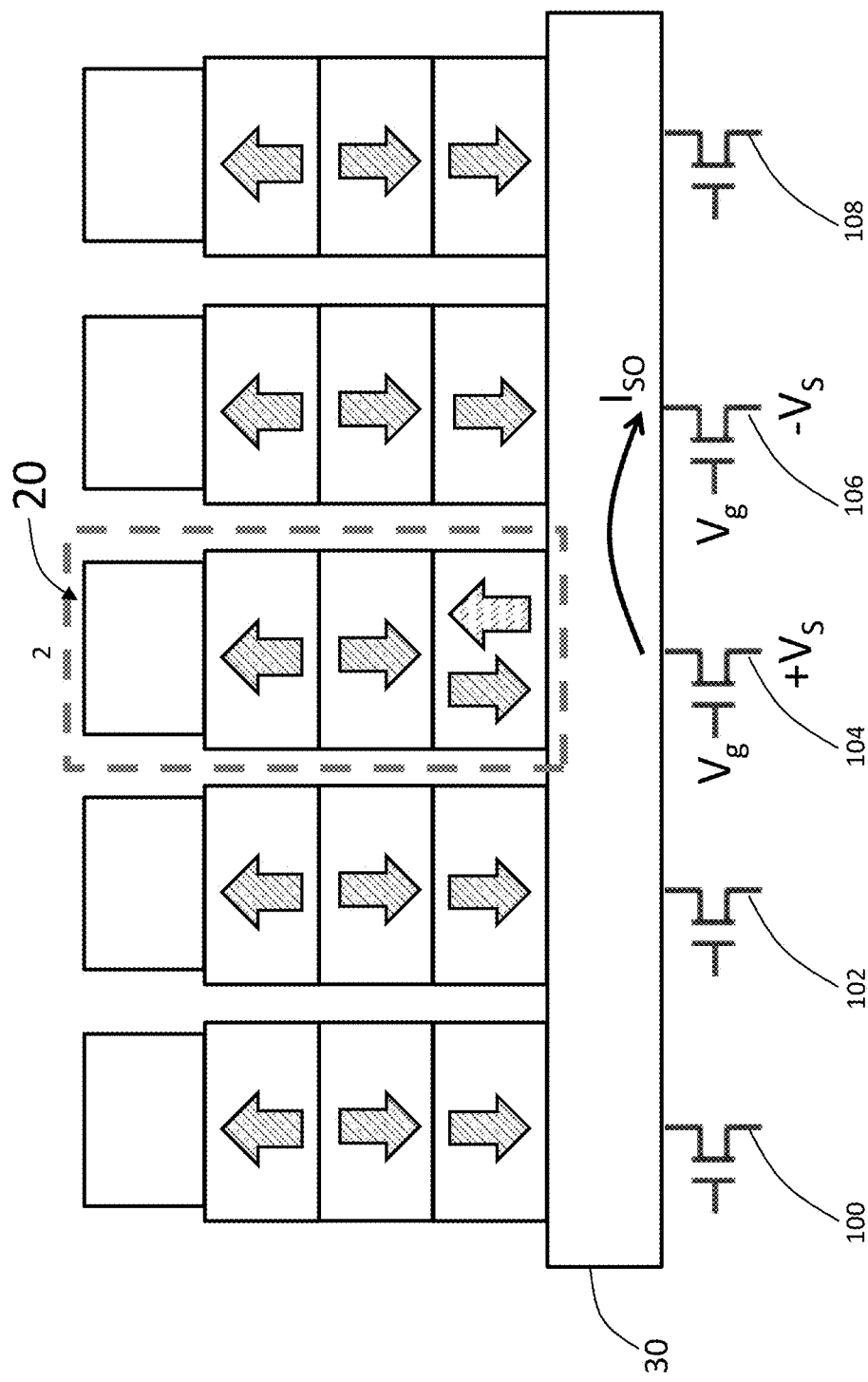

Aspects and embodiments of the invention allow for the access transistors 100, 102, 104, 106, 108 to be placed anywhere along the SO line 30, and for the SO line current $I_{SO}$ to be transmitted through any two of these access transistors 100, 102, 104, 106, 108. The invention is not limited to any particular number or placement of these access transistors. Furthermore, embodiments of the invention encompass the passing of currents $I_{SO}$ through any two or more of these transistors, whether they are adjacent to each other or not. FIG. 8 illustrates one such embodiment. Here, access transistors 100, 102, 104, 106, 108 are placed between adjacent MTJs 20, rather than at the center of each MTJ 20 as in FIG. 7. Currents $I_{SO}$ can be generated more precisely between only a single MTJ 20. In particular, similar to FIG. 7, when an SO line current is to be generated for the middle MTJ 20 of FIG. 8, the two adjacent access transistors 104 and 106 are turned on via application of gate voltages $V_g$, and source voltages $+V_s$ and $-V_s$ are applied to transistors 104 and 106 respectively. The resulting current $I_{SO}$ passes from one transistor 104 to the other 106, through only the portion of SO line 30 that passes directly under the middle MTJ 20. Similar to the embodiment of FIG. 7, this localized current $I_{SO}$ minimizes resistive losses in SO line 30.

Figure 9:
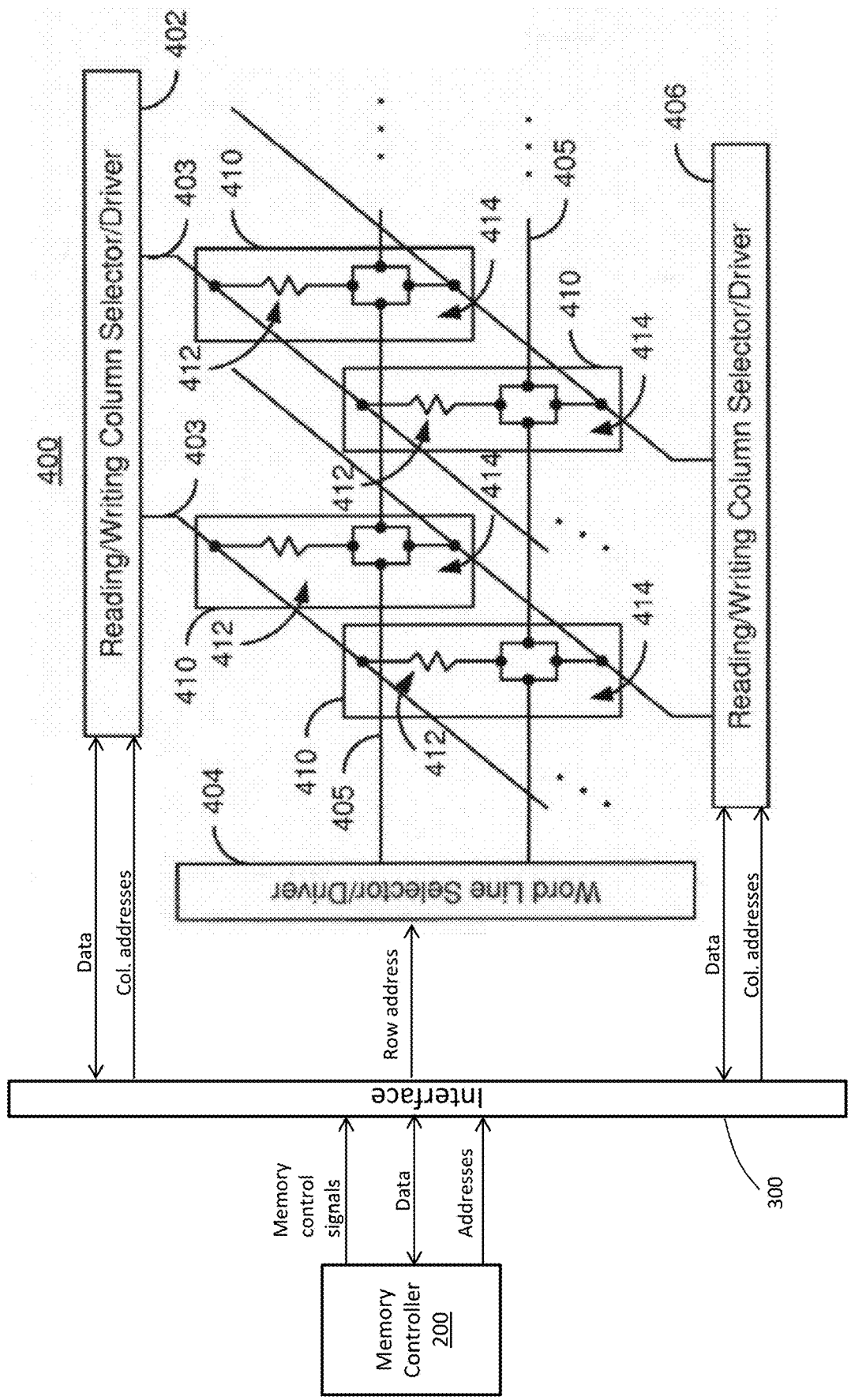
FIG. 9 illustrates a system for performing read operations of various embodiments of the present invention.

The read operations of embodiments of the present invention may be carried out by any suitable system or apparatus. FIG. 9 illustrates one such system. Here, magnetic memory system 400 includes a memory controller 200, interface 300, reading/writing column select drivers 402 and 406 as well as word line select driver 404. Note that other and/or different components having another arrangement may be provided. The storage region of the memory 400 includes magnetic storage cells 410. Each magnetic storage cell includes at least one magnetic junction 412 (which may include an MTJ 20) and at least one selection device 414. In some embodiments, the selection device 414 is a transistor. Although one magnetic junction 412 is shown per cell 410, in other embodiments, another number of magnetic junctions 412 may be provided per cell. Also shown are lines 403 and 405. The lines 403 may be SO and/or semi-spin valve (SSV) lines.

To access a particular storage cell 410, the corresponding word and bit/column lines should be selected and activated according to the cell 410 address. These addresses are transmitted by the memory controller 200. As the signal levels within and outside the memory array may be different, the addresses are converted by the line and column selectors 402, 404, 406, so that row and column positions are selected by the selectors/drivers 402, 404, 406. Once a particular cell 410 is selected in this manner, data read and data write operations may be performed on this selected cell 410. Data write operations may be performed in known manner, and data read operations may be performed according to embodiments of the invention such as those described above. Column addresses sent by memory controller 200 act to both select particular columns, and to route the corresponding data of a selected row to the data out buffers of memory interface 300. In this manner, controller 200 may initiate both write operations according to known methods, and read operations according to embodiments of the invention.

Many modifications and variations are possible in view of the above teachings. For example, embodiments of the invention encompass read operations performed by any one or more changes to reference line magnetic moments, rather than those of a free layer or another layer, and without need for a reference cell. Read operations may be conducted by comparing either read currents or voltages, and magnetic moments may be altered in direction by any amount sufficient to perform such comparisons accurately. The embodiments were chosen and described in order to best explain the principles of the invention and its practical applications, to thereby enable others skilled in the art to best utilize the invention and various embodiments with various modifications as are suited to the particular use contemplated. Also, individual features of any of the various embodiments or configurations described above can be mixed and matched in any manner, to create further embodiments contemplated by the invention.

What is claimed is:

1. A magnetic memory comprising:
   a magnetic tunnel junction including a first reference layer and a free layer;
   a spin orbit active (SO) line adjacent to the first reference layer of the magnetic tunnel junction, the SO line arranged to pass a first SO current in a first direction therethrough and a second SO current in a second direction therethrough; and a controller in electrical communication with the magnetic tunnel junction, the controller programmed to perform a read operation by passing the first and second SO currents through the SO line to generate two different directions of a magnetic moment in the first reference layer, such that a first read current $I_{read1}$ is generated during application of the first SO current, and a second read current $I_{read2}$ is generated during application of the second SO current, and wherein a logical state of the magnetic tunnel junction that is read depends on which of the first read current $I_{read1}$ and the second read current $I_{read2}$ has a larger magnitude.

2. The magnetic memory of claim 1, the read operation further comprising, in order:
   initiating transmission of the first SO current through the SO line so as to reverse a direction of a magnetic moment of the first reference layer;
   initiating transmission of the first read current through the magnetic tunnel junction;
   initiating transmission of the second SO current through the SO line so as to reverse the direction of the magnetic moment of the first reference layer;
   initiating transmission of the second read current through the magnetic tunnel junction; and
   comparing a magnitude of the first read current to the magnitude of the second read current so as to determine information stored in the memory.

3. The magnetic memory of claim 2, wherein the transmission of a first read current occurs during the transmission of the first SO current, and wherein the transmission of a second read current occurs during the transmission of the second SO current.

4. The magnetic memory of claim 2, wherein the comparing a magnitude further comprises:
   determining the information stored in the memory to be a first binary value if the magnitude of the first read current is greater than the magnitude of the second read current; and
   determining the information stored in the memory to be a second binary value if the magnitude of the first read current is not greater than the magnitude of the second read current.

5. The magnetic memory of claim 1:
   wherein the magnetic memory further comprises a comparator circuit in electrical communication with the SO line, the comparator circuit having a first capacitor and a second capacitor; and
   wherein the read operation further comprises, in order:
      initiating transmission of the first SO current through the SO line so as to reverse a direction of a magnetic moment of the first reference layer;
      initiating transmission of a first read current through the magnetic tunnel junction, the first read current generating a first voltage at the SO line;
      storing the first voltage in the first capacitor;
      initiating transmission of the second SO current through the SO line so as to reverse the direction of the magnetic moment of the first reference layer;
      initiating transmission of a second read current through the magnetic tunnel junction, the second read current generating a second voltage at the SO line;
      storing the second voltage in the second capacitor; and
      comparing a magnitude of the stored first voltage to the magnitude of the stored second voltage so as to determine information stored in the memory.

6. The magnetic memory of claim 5, wherein the comparing a magnitude further comprises:
   determining the information stored in the memory to be a first binary value if the magnitude of the stored first voltage is greater than the magnitude of the stored second voltage; and
   determining the information stored in the memory to be a second binary value if the magnitude of the stored first voltage is not greater than the magnitude of the stored second voltage.

7. The magnetic memory of claim 1, further comprising a plurality of the magnetic tunnel junctions, the SO line adjacent to and in electrical communication with each magnetic tunnel junction of the plurality of magnetic tunnel junctions.

8. The magnetic memory of claim 7, wherein the magnetic memory further comprises a comparator circuit in electrical communication with the SO line, the comparator circuit having a first capacitor and a second capacitor.

9. The magnetic memory of claim 7, wherein the magnetic tunnel junctions of the plurality of magnetic tunnel junctions share a common first reference layer.

10. The magnetic memory of claim 7, wherein a conductivity of the SO line is greater than the conductivity of the first reference layer.

11. The magnetic memory of claim 7, further comprising a plurality of switching elements each in electrical communication with the SO line and each positioned to correspond to one of the magnetic tunnel junctions.

12. The magnetic memory of claim 11:
   wherein each switching element is aligned with a geometric center of one of the magnetic tunnel junctions; and
   wherein, for each magnetic tunnel junction, the first and second SO currents are passed through the switching elements corresponding to magnetic tunnel junctions adjacent to the each magnetic tunnel junction.

13. The magnetic memory of claim 11:
   wherein each switching element is positioned between adjacent magnetic tunnel junctions; and
   wherein, for each magnetic tunnel junction, the first and second SO currents are passed through the switching elements positioned between the each magnetic tunnel junction and adjacent magnetic tunnel junctions.

14. The magnetic memory of claim 1, the magnetic tunnel junction further comprising a second reference layer, the magnetic tunnel junction having, in order, the first reference layer, the free layer, and the second reference layer.

15. The magnetic memory of claim 1, further comprising a bit line in electrical communication with the magnetic tunnel junction:
   wherein the magnetic memory further comprises a comparator circuit in electrical communication with the bit line, the comparator circuit having a first capacitor and a second capacitor; and
   wherein the read operation further comprises, in order:
      initiating transmission of the first SO current through the SO line so as to reverse a direction of a magnetic moment of the first reference layer;
      initiating transmission of a first read current through the magnetic tunnel junction, the first read current generating a first voltage at the bit line;
      storing the first voltage in the first capacitor;
      initiating transmission of the second SO current through the SO line so as to reverse the direction of the magnetic moment of the first reference layer;
      initiating transmission of a second read current through the magnetic tunnel junction, the second read current generating a second voltage at the bit line;

storing the second voltage in the second capacitor; and
comparing a magnitude of the stored first voltage to the magnitude of the stored second voltage so as to determine information stored in the memory.

16. A method of reading information stored in a magnetic memory, the method comprising:
in a magnetic memory comprising a magnetic tunnel junction including a first reference layer and a free layer, and a spin orbit active (SO) line adjacent to the first reference layer of the magnetic tunnel junction, passing first and second currents through the SO line so as to achieve two different directions of a magnetic moment of the first reference layer, such that a first read current $I_{read1}$ is generated during application of the first SO current, and a second read current $I_{read2}$ is generated during application of the second SO current;
comparing the first read current $I_{read1}$ and the second read current $I_{read2}$ of the magnetic tunnel junction, each corresponding to one of the two different directions of the magnetic moment of the first reference layer; and
determining a logical state of the magnetic tunnel junction based on which of the first read current $I_{read1}$ and the second read current $I_{read2}$ has a larger magnitude.

17. The method of claim 16, wherein the two electrical characteristics are voltages.

18. The method of claim 16, wherein the two electrical characteristics are electrical currents.

19. The method of claim 16, wherein the first and second currents are first and second SO currents, and wherein the passing, the determining, and the comparing collectively further comprise:
transmitting the first SO current through the SO line so as to reverse a direction of a magnetic moment of the first reference layer;
transmitting a first read current through the magnetic tunnel junction;
transmitting the second SO current through the SO line so as to reverse the direction of the magnetic moment of the first reference layer;
transmitting a second read current through the magnetic tunnel junction; and
comparing a magnitude of the first read current to the magnitude of the second read current so as to determine the information stored in the memory.

20. The method of claim 16:
wherein the magnetic memory further comprises a comparator circuit in electrical communication with the SO line, the comparator circuit having a first capacitor and a second capacitor;
wherein the first and second currents are first and second SO currents; and
wherein the passing, the determining, and the comparing collectively further comprise, in order:
transmitting the first SO current through the SO line so as to reverse a direction of a magnetic moment of the first reference layer;
transmitting a first read current through the magnetic tunnel junction, the first read current generating a first voltage at the SO line;
storing the first voltage in the first capacitor;
transmitting the second SO current through the SO line so as to reverse the direction of the magnetic moment of the first reference layer;
transmitting a second read current through the magnetic tunnel junction, the second read current generating a second voltage at the SO line;
storing the second voltage in the second capacitor; and
comparing a magnitude of the stored first voltage to the magnitude of the stored second voltage so as to determine the information stored in the memory.

21. The method of claim 16, wherein the passing further comprises passing the first and second currents through only a portion of the SO line proximate to the magnetic tunnel junction.

22. A magnetic memory comprising:
a magnetic tunnel junction including a reference layer and a free layer;
a spin orbit active (SO) line adjacent to the reference layer of the magnetic tunnel junction, the SO line arranged to pass a current therethrough; and
a controller in electrical communication with the magnetic tunnel junction, the controller programmed to perform a read operation, the read operation comprising:
determining a first electrical characteristic of the magnetic tunnel junction during application of a first SO current on the SO line;
passing the current through the SO line so as to change a direction of a magnetic moment of the first reference layer by less than 90°, and so as to form a changed direction of the magnetic moment of the first reference layer;
after the passing, determining a second electrical characteristic of the magnetic tunnel junction during application of a second SO current on the SO line, the second electrical characteristic corresponding to the changed direction; and
determining a logical state of the magnetic tunnel junction based on which of the two electrical characteristics has a larger magnitude.

23. The magnetic memory of claim 22, wherein the first and second electrical characteristics are both electrical currents or both voltages.

* * * * *